United States Patent
Lee et al.

(10) Patent No.: US 8,520,461 B2
(45) Date of Patent: Aug. 27, 2013

(54) ROW ADDRESS CODE SELECTION BASED ON LOCATIONS OF SUBSTANDARD MEMORY CELLS

(75) Inventors: Dong-Hyuk Lee, Seoul (KR); Jung-Bae Lee, Yongin-si (KR); Ki-Won Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 362 days.

(21) Appl. No.: 12/832,208

(22) Filed: Jul. 8, 2010

(65) Prior Publication Data

US 2011/0069572 A1   Mar. 24, 2011

(30) Foreign Application Priority Data

Sep. 18, 2009   (KR) .................. 10-2009-0088368

(51) Int. Cl.
*G11C 7/00*   (2006.01)
(52) U.S. Cl.
USPC ........................................... 365/222
(58) Field of Classification Search
USPC ........................................... 365/222
See application file for complete search history.

(56) References Cited

U.S. PATENT DOCUMENTS

| | | | |
|---|---|---|---|
| 5,208,782 A * | 5/1993 | Sakuta et al. | 365/230.03 |
| 7,167,403 B2 | 1/2007 | Riho et al. | |
| 7,313,045 B2 | 12/2007 | Hosokawa et al. | |
| 7,734,866 B2 * | 6/2010 | Tsern | 711/106 |
| 2004/0196719 A1 | 10/2004 | Aritomi et al. | |
| 2007/0195631 A1* | 8/2007 | Hoffmann | 365/230.03 |
| 2008/0137463 A1 | 6/2008 | Ishikawa | |
| 2008/0181017 A1* | 7/2008 | Watanabe et al. | 365/185.25 |
| 2009/0059653 A1* | 3/2009 | Luk et al. | 365/149 |

FOREIGN PATENT DOCUMENTS

| | | |
|---|---|---|
| JP | 05109268 A | 4/1993 |
| JP | 2002063787 A | 2/2002 |
| KR | 1020050010655 A | 1/2005 |

\* cited by examiner

*Primary Examiner* — Hoai V Ho
*Assistant Examiner* — Min Huang
(74) *Attorney, Agent, or Firm* — Volentine & Whitt, PLLC

(57) ABSTRACT

A memory device identifies memory blocks that contain substandard memory cells. The memory device then determines row address codes to apply to the memory blocks during refresh operations. The row address codes determine which memory blocks of the memory block are refreshed together. The row address codes are designed to ensure that memory blocks having substandard memory cells, which must be refreshed more frequently than other cells, are refreshed together, while memory blocks without substandard memory cells are refreshed together.

20 Claims, 21 Drawing Sheets

Values of Row Address Code RA[12:9]

Values of Row Address Code RA[12:9]

FIG. 7A

| | RA12 | RA11 | RA10 | |
|---|---|---|---|---|
| a | 0 | 0 | 0 | 111 |
| a | 0 | 0 | 0 | 112 |
| b | 0 | 0 | 1 | 121 |
| b | 0 | 0 | 1 | 122 |
| c | 0 | 1 | 0 | 131 |
| c | 0 | 1 | 0 | 132 |
| d | 0 | 1 | 1 | 141 |
| d | 0 | 1 | 1 | 142 |
| e | 1 | 0 | 0 | 151 |
| e | 1 | 0 | 0 | 152 |
| f | 1 | 0 | 1 | 161 |
| f | 1 | 0 | 0 | 162 |
| g | 1 | 1 | 0 | 171 |
| g | 1 | 1 | 0 | 172 |
| h | 1 | 1 | 1 | 181 |
| h | 1 | 1 | 1 | 182 |

Substandrd cells in blocks
(a)-(c) and (e)-(h)
(7total)

FIG. 7B

| | RA12 | RA11 | RA09 | |
|---|---|---|---|---|
| a | 0 | 0 | 0 | 111 |
| b | 0 | 0 | 1 | 112 |
| a | 0 | 0 | 0 | 121 |
| b | 0 | 0 | 1 | 122 |
| c | 0 | 1 | 0 | 131 |
| d | 0 | 1 | 1 | 132 |
| c | 0 | 1 | 0 | 141 |
| d | 0 | 1 | 1 | 142 |
| e | 1 | 0 | 0 | 151 |
| f | 1 | 0 | 1 | 152 |
| e | 1 | 0 | 0 | 161 |
| f | 1 | 0 | 1 | 162 |
| g | 1 | 1 | 0 | 171 |
| h | 1 | 1 | 1 | 172 |
| g | 1 | 1 | 0 | 181 |
| h | 1 | 1 | 1 | 182 |

Substandrd cells in blocks
(a), (d), (e) and (g)
(4total)

FIG. 7C

| | RA12 | RA10 | RA09 | |
|---|---|---|---|---|
| a | 0 | 0 | 0 | 111 |
| b | 0 | 0 | 1 | 112 |
| c | 0 | 1 | 0 | 121 |
| d | 0 | 1 | 1 | 122 |
| a | 0 | 0 | 0 | 131 |
| b | 0 | 0 | 1 | 132 |
| c | 0 | 1 | 0 | 141 |
| d | 0 | 1 | 1 | 142 |
| e | 1 | 0 | 0 | 151 |
| f | 1 | 0 | 1 | 152 |
| g | 1 | 1 | 0 | 161 |
| h | 1 | 0 | 1 | 162 |
| e | 1 | 0 | 0 | 171 |
| f | 1 | 0 | 1 | 172 |
| g | 1 | 1 | 0 | 181 |
| h | 1 | 1 | 1 | 182 |

Substandrd cells in blocks
(a), (b), (c), (e) and (g)
(5total)

FIG. 7D

| | RA11 | RA10 | RA09 | |
|---|---|---|---|---|
| a | 0 | 0 | 0 | 111 |
| b | 0 | 0 | 1 | 112 |
| c | 0 | 1 | 0 | 121 |
| d | 0 | 1 | 1 | 122 |
| e | 1 | 0 | 0 | 131 |
| f | 1 | 0 | 1 | 132 |
| g | 1 | 1 | 0 | 141 |
| h | 1 | 1 | 1 | 142 |
| a | 0 | 0 | 0 | 151 |
| b | 0 | 0 | 1 | 152 |
| c | 0 | 1 | 0 | 161 |
| d | 0 | 0 | 1 | 162 |
| e | 1 | 0 | 0 | 171 |
| f | 1 | 0 | 1 | 172 |
| g | 1 | 1 | 0 | 181 |
| h | 1 | 1 | 1 | 182 |

Substandrd cells in blocks
(a), (c), (f), (e) and (g)
(5total)

FIG. 14C

| FUSE i | P1 | P2 | P3 | P4 |
|---|---|---|---|---|
| 0 | REFRESH | REFRESH | REFRESH | REFRESH |
| 1 | REFRESH | SKIP | REFRESH | SKIP |

FIG. 14D

| | RA12 | RA11 | RA10 | RA09 | | |
|---|---|---|---|---|---|---|
| 111 | 0 | 0 | 0 | 0 | NOT CUT | 0 |
| 112 | 0 | 0 | 0 | 1 | CUT | 1 |
| 121 | 0 | 0 | 1 | 0 | NOT CUT | 0 |
| 122 | 0 | 0 | 1 | 1 | CUT | 1 |
| 131 | 0 | 1 | 0 | 0 | CUT | 1 |
| 132 | 0 | 1 | 0 | 1 | NOT CUT | 0 |
| 141 | 0 | 1 | 1 | 0 | CUT | 1 |
| 142 | 0 | 1 | 1 | 1 | NOT CUT | 0 |
| 151 | 1 | 0 | 0 | 0 | NOT CUT | 0 |
| 152 | 1 | 0 | 0 | 1 | CUT | 1 |
| 161 | 1 | 0 | 1 | 0 | NOT CUT | 0 |
| 162 | 1 | 0 | 0 | 1 | CUT | 1 |
| 171 | 1 | 1 | 0 | 0 | NOT CUT | 0 |
| 172 | 1 | 1 | 0 | 1 | CUT | 1 |
| 181 | 1 | 1 | 1 | 0 | NOT CUT | 0 |
| 182 | 1 | 1 | 1 | 1 | CUT | 1 |

FIG. 15B

| FUSE i | | P1 | P2 | P3 | P4 |
|---|---|---|---|---|---|
| 1 | 2 | | | | |
| 0 | 0 | REFRESH | REFRESH | REFRESH | REFRESH |
| 0 | 1 | REFRESH | SKIP | REFRESH | SKIP |
| 1 | 0 | SKIP | REFRESH | SKIP | REFRESH |
| 1 | 1 | REFRESH | SKIP | SKIP | SKIP |

ROW ADDRESS CODE SELECTION BASED ON LOCATIONS OF SUBSTANDARD MEMORY CELLS

CROSS-REFERENCE TO RELATED APPLICATION

This U.S. non-provisional patent application claims priority under 35 U.S.C. §119 to Korean Patent Application No. 10-2009-0088368 filed Sep. 18, 2009, the subject matter of which is hereby incorporated by reference.

BACKGROUND

Volatile memories such as dynamic random access memory (DRAM) continue to play a major role in modern electronics due to their high integration density and operating speed. These memories are commonly used, for instance, as the main memories, caches, and data buffers of personal computers, workstations, gaming-consoles, and handheld devices, to name but a few.

One major drawback of volatile memories is that their memory cells lose stored data in the absence of applied power. This data loss typically occurs because stored electrical charges tend to diffuse away from the constituent memory cells, allowing stored data to fade over time. DRAM cells, for instance, store data by placing electrical charge on capacitors, and the stored information fades as the charge dissipates or leaks away from the capacitors.

To prevent stored information from being lost entirely, volatile memory cells may be periodically refreshed (or recharged) during a refresh operation. A typical refresh operation comprises a sensing step for detecting the logic state (e.g., '0' or '1') of stored data, and a refresh step for applying additional charge to the cells in accordance with the detected logic state.

Unfortunately, different volatile memory cells tend to have different charge retention characteristics due to variances in memory fabrication processes. As a result, some memory cells may need to be recharged more frequently than others. In other words, due to the different charge retention characteristics, some memory cells lose data more quickly than other memory cells and require the application of a refresh operation having a shorter period.

The presence of memory cells with different refresh requirements creates a number of potential problems for the overall design and timing of volatile memory devices. For instance, if all memory cells are required to be refreshed with the same period, the period must be short enough so that data is not lost from the memory cells having the poorest charge retention characteristics. This, however, results in inefficient power consumption. On the other hand, if different refresh timing is used for different memory cells, the memory device may require complex additional circuitry and logic, resulting in inefficient use of chip area.

In sum, there is a tradeoff between the specificity of refresh timing and the complexity of refresh circuitry. As refresh timing becomes more specific to the requirements of individual memory cells, the complexity of refresh circuitry tends to increase, and vice versa.

SUMMARY

Recognizing a need to account for the different charge retention characteristics of different memory cells while limiting the complexity of refresh circuitry in a memory device, the inventive concept provides methods, systems and devices in which multiple memory blocks are refreshed simultaneously in groups, taking into account whether the multiple memory blocks include substandard memory cells requiring frequent refreshing. Groups of memory blocks that include substandard memory cells are refreshed with a first refresh period, and groups of memory blocks that do not include substandard memory cells are refreshed with a second refresh period longer than the first refresh period. The groups of memory cells are generally organized in a manner that limits the number of memory blocks requiring frequent refreshing while also limiting the complexity of refresh circuitry.

According to one embodiment of the inventive concept, a method of operating a memory device is provided. The method identifies a first plurality of memory blocks each comprising at least one substandard memory cell, and further identifies a second plurality of memory blocks each comprising no substandard memory cells. The method generates a row address code with a first value corresponding to two or more memory blocks, where at least one of the two or more memory blocks is from the first plurality of memory blocks, and further generates a row address code with a second value corresponding to at least two memory blocks from the second plurality of memory blocks. Thereafter, the method performs a first refresh operation on the memory blocks corresponding to the first row address code value using a first refresh period, and performs a second refresh operation on the memory blocks corresponding to the second row address code value with a second refresh period longer than the first refresh period.

According to another embodiment of the inventive concept, another method of operating a memory device is provided. The method comprises identifying a row address code corresponding to a plurality of memory blocks, wherein different values of the row address code identify different ones of the plurality of memory blocks, determining whether each of the plurality of memory blocks comprises at least one substandard memory cell, generating an abbreviated row address code by omitting one or more bits of the row address code based on which of the memory blocks comprises at least one substandard memory cell, and performing a refresh operation by simultaneously refreshing memory blocks having the same value of the abbreviated row address code.

According to still another embodiment of the inventive concept, yet another method of performing a refresh operation is provided. The method comprises refreshing a first group of memory blocks using a first refresh period, and refreshing a second group of memory blocks using a second refresh period longer than the first refresh period. The first group comprises memory blocks with substandard memory cells and the second group comprises no memory blocks with substandard memory cells, and the grouping of the memory blocks into the first and second groups minimizes the total number of memory blocks using the first refresh period while allowing memory cells with the same value of an abbreviated row address code to be refreshed simultaneously.

According to another embodiment of the inventive concept, a memory device is provided. the memory device comprises a memory cell array comprising a plurality of memory blocks each corresponding to a different value of a row address code, wherein a subset of the memory blocks each comprise at least one substandard memory cell, and a controller configured to perform a refresh operation on the plurality of memory blocks using an abbreviated row address code formed of a subset of row address bits from the row address code, wherein each value of the abbreviated row address code corresponds to a group of at least two of the plurality of memory blocks. The memory device further comprises a selection circuit configured to select the abbreviated row address code from among a plurality of candidate abbreviated row address codes so as to minimize the number of groups having a memory block with at least one substandard memory cell.

According to yet another embodiment of the inventive concept, a memory system is provided. The memory system comprises a memory cell array comprising a plurality of memory blocks each corresponding to a different value of a row address code, wherein a subset of the memory blocks each comprise at least one substandard memory cell. The system further comprises a substandard memory cell detector configured to detect memory blocks having substandard memory cells, a controller configured to perform a refresh operation on the plurality of memory blocks using an abbreviated row address code formed of a subset of row address bits from the row address code, wherein each value of the abbreviated row address code corresponds to a group of at least two of the plurality of memory blocks, and a selection circuit configured to select the abbreviated row address code from among a plurality of candidate abbreviated row address codes so as to minimize the number of groups having a memory block with at least one substandard memory cell.

According to still another embodiment of the inventive concept, a memory device is provided. The memory device comprises a first plurality of memory blocks each comprising at least one substandard memory cell, a second plurality of memory blocks each comprising no substandard memory cells, and a control circuit configured to generate a row address code with a first value corresponding to two or more memory blocks, where at least one of the two or more memory blocks is from the first plurality of memory blocks, and further configured to generate a row address code with a second value corresponding to at least two memory blocks from the second plurality of memory blocks. The memory device further comprises a refresh circuit configured to perform a first refresh operation on the memory blocks corresponding to the first row address code value using a first refresh period, and further configured to perform a second refresh operation on the memory blocks corresponding to the second row address code value with a second refresh period longer than the first refresh period.

BRIEF DESCRIPTION OF THE DRAWINGS

Embodiments of the inventive concept will be more clearly understood from the following detailed description taken in conjunction with the accompanying drawings. In the drawings, like reference numbers denote like features.

FIGS. 7A through 7D are tables illustrating abbreviated row address codes and corresponding memory blocks.

FIG. 14C is a table illustrating a relationship between different states of the fuse unit of FIG. 14B and the operation of the refresh cycle controller.

FIG. 14D is a table further illustrating a relationship between different states of the fuse unit of FIG. 14B and the operation of the refresh cycle controller.

FIG. 15B is a table illustrating a relationship between different states of the fuse unit of FIG. 15A and the operation of the refresh cycle controller.

DETAILED DESCRIPTION OF EMBODIMENTS

Selected embodiments of the inventive concept are described below with reference to the corresponding drawings. These embodiments are presented as teaching examples and should not be interpreted to limit the scope of the inventive concept.

In general, embodiments of the inventive concept relate to memory devices, systems, and methods designed to reduce the amount of power required to execute refresh operations. For instance, some embodiments reduce the power consumption of refresh operations by identifying memory blocks containing memory cells with poor charge retention characteristics, and refreshing those memory blocks as a group while refreshing other memory blocks separately. Groups that do not contain any memory cells with poor charge retention characteristics can be refreshed less frequently than the groups that do contain such memory cells, reducing the overall power required to refresh all of the memory blocks.

Memory cells that require a refresh operation more frequently than others because they fall below a predetermined quality standard are termed "substandard" cells. The quality standard may be defined, for instance, by how long the memory cells retain stored data in the absence of power. As an example, memory cells that retain stored information longer than a predetermined interval (e.g., 256 ms) may be designated as normal memory cells, while memory cells that do not retain stored information longer than the predetermined interval may be designated as substandard memory cells.

To determine whether memory cells are normal or substandard, a detection procedure may be performed on the memory cells following manufacture. Such a detection procedure may involve, for instance, programming all of the memory cells to a particular value and then measuring their values as time passes. Cells that maintain their initial values after the predetermined interval may be designated as normal, while those that do not may be designated as substandard.

In some embodiments, the process of detecting substandard memory cells may be performed using one or more components external to the memory device. For instance, the process may be performed by reading stored data into a cache and using a central processing unit (CPU) to evaluate and record the locations of the substandard memory cells. In other embodiments, the process could be performed by elements forming part of the memory device.

Once memory cells have been designated as normal or substandard, a memory chip or other device including the memory cells may be configured so that memory blocks including the substandard memory cells are refreshed in separate groups from memory blocks not including sub-standard cells. Such configuration may be performed, for instance, by cutting selected fuses to alter refresh circuitry based on the locations of the substandard memory cells, or by employing software or various alternative forms of reconfigurable hardware.

Figure 1:
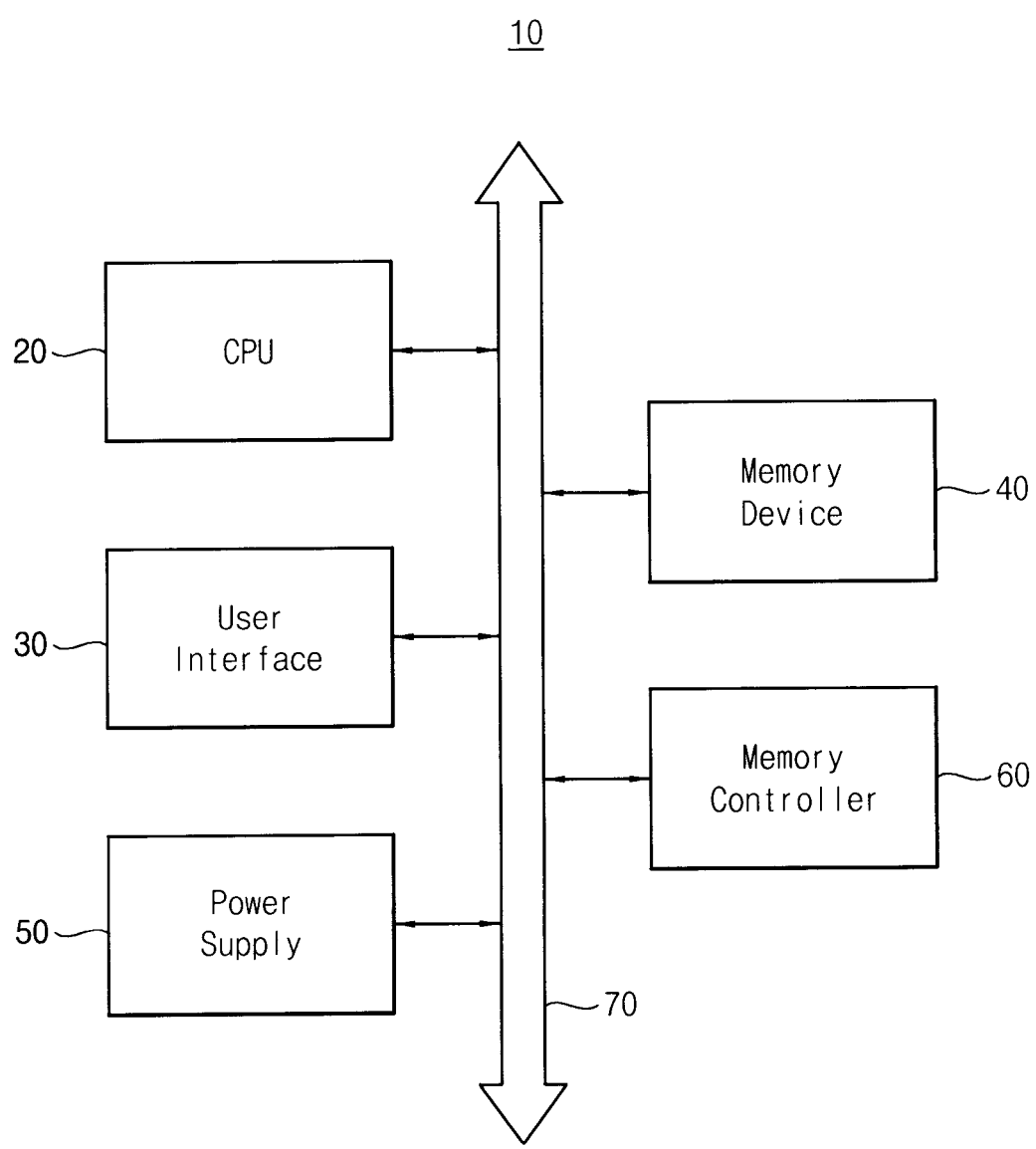
FIG. 1 is a block diagram illustrating a system comprising a memory device in accordance with an embodiment of the inventive concept.

FIG. 1 shows a basic example of a system 10 in which selected embodiments of the inventive concept may be implemented. System 10 comprises a CPU 20, a user interface 30, a power supply 50, a memory device 40, and a memory controller 60, all connected to each other by a bus and/or network architecture 70.

System 10 may take any of several different forms, such as a personal computer, workstation, networking device, gaming-console, handheld device, or embedded system, to name but a few. Additionally, system 10 and its components may be distributed or divided into many sub-components, such as multiple CPU cores, distributed memories, a distributed bus or network architecture, remote user interfaces, and so on.

System 10 may be implemented as a portable or non-portable device. Accordingly, power supply 50 may comprise a portable source of power, such as a battery, or a stationary source of power, such as an alternating current (AC) outlet. Moreover, power supply 50 may comprise more than one source of power for powering different elements of system 10.

Memory device 40 typically comprises at least one volatile memory such as a DRAM. Moreover, memory device 40 may comprise more than one memory chip, which may include multiple types and sizes of memories, as well as memories using different protocols. For instance, memory device 40 may comprise a volatile memory such as a DRAM in combination with other forms of memory such as a nonvolatile memory.

Memory device 40 and any constituent chips may be organized in any of several different architectures. For instance, memory device 40 may be organized in any number of chips, banks, memory blocks, sectors, and so on. Such elements may be arranged in hierarchies (e.g., L2, L3 caches, etc.), in parallel, or in a combination of hierarchical, parallel, or other configuration.

Memory device 40 may be packaged or integrated with other devices to form any of several different products or components. For instance, memory device 40 may be packaged in a memory card or other standalone memory product, or it may form part of a system-on-a-chip having numerous additional elements.

Figure 2:
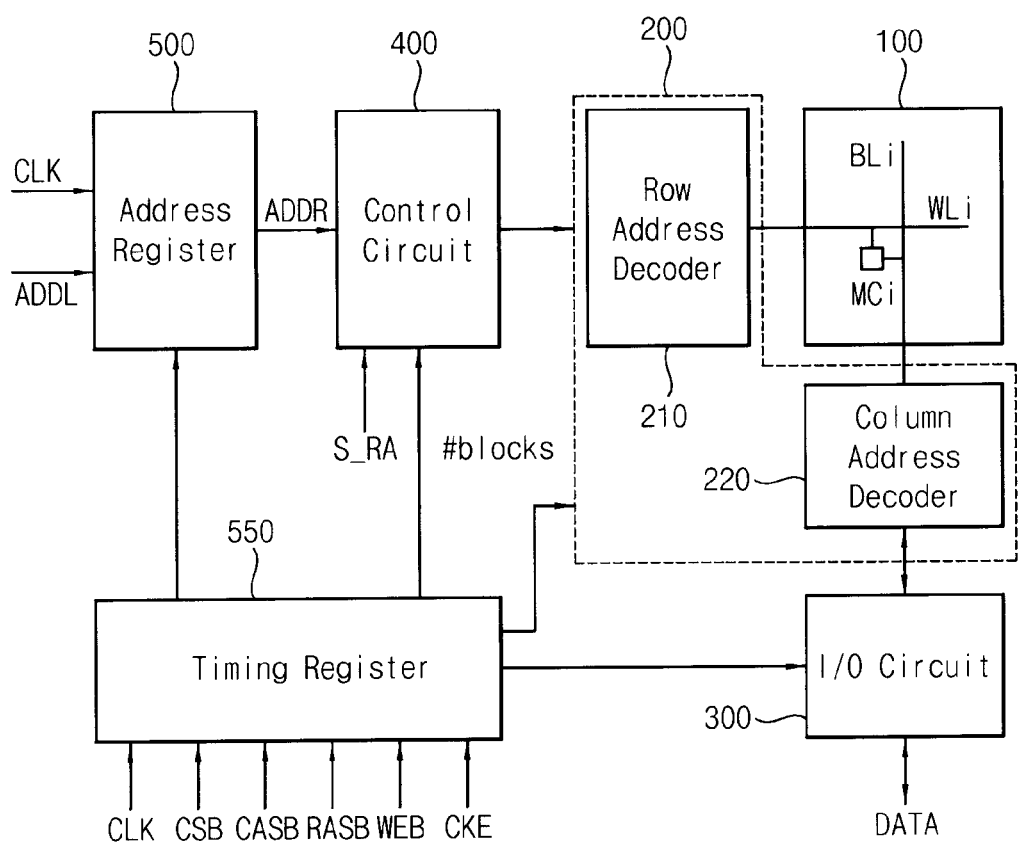
FIG. 2 is a block diagram illustrating an example of the memory device shown in FIG. 1.

FIG. 2 illustrates an example configuration of memory device 40 in accordance with one embodiment of the inventive concept. In this example, memory device 40 comprises a memory cell array 100, an address decoder 200, an input/output (IO) circuit 300, a control circuit 400, an address register 500, and a timing register 550.

Memory cell array 100 comprises a plurality of memory cells arranged in rows and columns, where each row is connected to a corresponding word line and each column is connected to a corresponding bit line. In certain embodiments, the memory cells comprise DRAM cells. The memory cells are typically divided into memory blocks, where each memory block is refreshed as a unit, and all of the memory blocks are refreshed in succession during a refresh cycle of memory cell array.

The memory blocks of memory cell array 100 are typically designated by a portion of a row address. For instance, assuming memory cell array 100 comprises $2^m$ rows of memory cells addressable by an m-bit row address, a sub-portion of the m-bit row address may designate rows belonging to the same memory block. As a more concrete example, assume memory cells of memory cell array 100 are addressable by a 13-bit row address designated RA[12:0], where RA12 denotes a first bit, RA11 denotes a second bit, etc.; the bits RA[12:9] may be used to designate different memory blocks. In other words, memory cells having the same row address bits RA[12:9] form part of the same memory block, and therefore the bits RA[12:9] may be used as a row address (RA) code for selecting a memory block for different operations such as a refresh operation. Because row address code RA[12:9] has four bits, it can be used to divide memory cell array 100 into sixteen memory blocks corresponding to the sixteen possible values of RA[12:9]: "0000," "0001," "0010", . . . , "1111."

Address decoder 200 comprises a row address decoder 210 and a column address decoder 220. Address decoder 200 receives an address ADDR from control circuit 400 indicating a location of memory cells to be programmed in memory cell array 100. Address decoder 200 further receives refresh cycle information indicating an order in which to refresh memory blocks during a refresh operation, and the duration of a refresh operation to be performed on each memory block. As an example, the refresh cycle information may indicate a refresh period tREF or provide a refresh enable signal REF_EN for each refresh operation. It may also indicate that certain memory blocks will be refreshed at the same time as each other.

For read and write operations, row address decoder 210 and column address decoder 220 decode address ADDR to generate a row address RA[12:0] and a column address CA[12:0] of selected memory cells. For refresh operations, row address decoder 210 and column address decoder 220 use the refresh cycle information to control the order and duration of refresh signals applied to the memory blocks of memory cell array 100.

IO circuit 300 comprises a data buffer for receiving and storing input data DATA to be written to memory cell array 100 in a write operation, and output data DATA to be read from memory cell array 100 in a read operation.

Control circuit 400 comprises various elements for determining the timing for refresh operations to be performed on memory cell array 100. Control circuit 400 receives address ADDR, a row address code selection signal S_RA, and an indication of the number of memory blocks in memory cell array 100. Based on this information, control circuit 400 generates a refresh enable signal REF_EN to control refresh periods of different memory blocks and/or groups of memory blocks.

Address register 500 comprises storage elements and data for receiving a logical address ADDL and converting logical address ADDL into address ADDR. In other words, address register 500 implements a mapping scheme for mapping between a logical address and a physical address of memory cell array 100. Address register 500 receives logical address ADDL and a clock signal CLK from an external source and outputs address ADDR to control signal 400.

Timing register 550 comprises timing elements for controlling the operation of other elements of memory device 40. In particular, timing register 550 comprises registers for storing and outputting clock signal CLK, a chip select signal CSB, a row address strobe signal RASB, a column address strobe signal CASB, a write enable signal WEB, and a clock enable signal CKE. Timing register 550 outputs these various signals to address decoder 200, control circuit 400, address register 500, and IO data circuit 300 to control the timing of various operations including the transfer of information to other elements.

Figure 3:
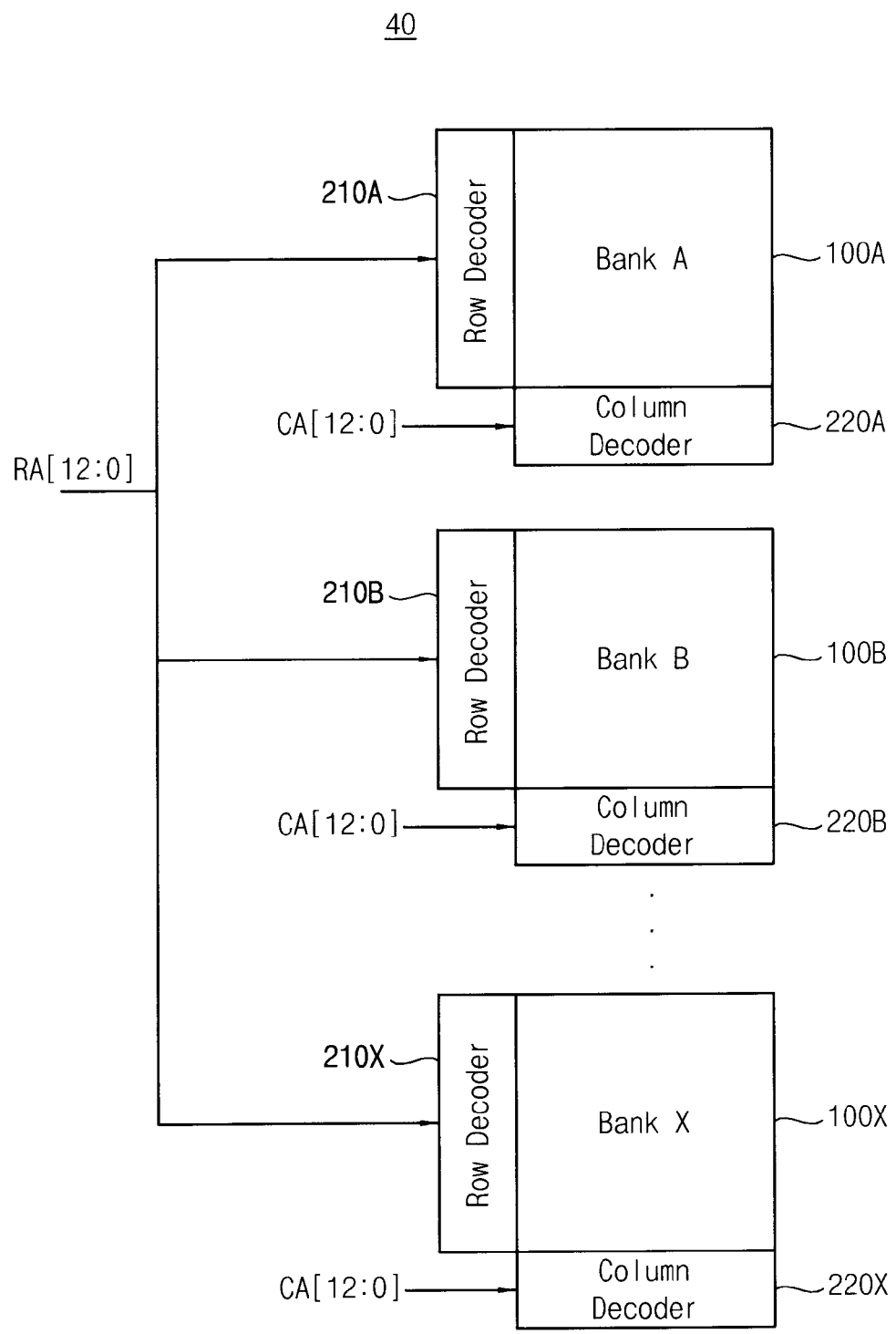
FIG. 3 is a block diagram illustrating an alternative configuration of the memory device illustrated in FIG. 2.

FIG. 3 is a block diagram illustrating an alternative configuration of memory cell array 100 and row and column decoders 210 and 220. In this configuration, memory cell array 100 is divided into a plurality of banks 100A through 100X, row decoder 210 is divided into a plurality of row decoders 210A through 210X, and column decoder 220 is divided into a plurality of column decoders 220A through 220X. Column decoders 220A through 220X each receive a column address CA[12:0] derived from address ADDR. Similarly, row decoders 210A through 210X receive a row address RA[12:0] derived from address ADDR. Each of memory banks 100A through 100X comprises a plurality of memory blocks that can be refreshed in groups based on the locations of substandard memory cells, similar to the configuration of FIG. 2.

Figure 4:
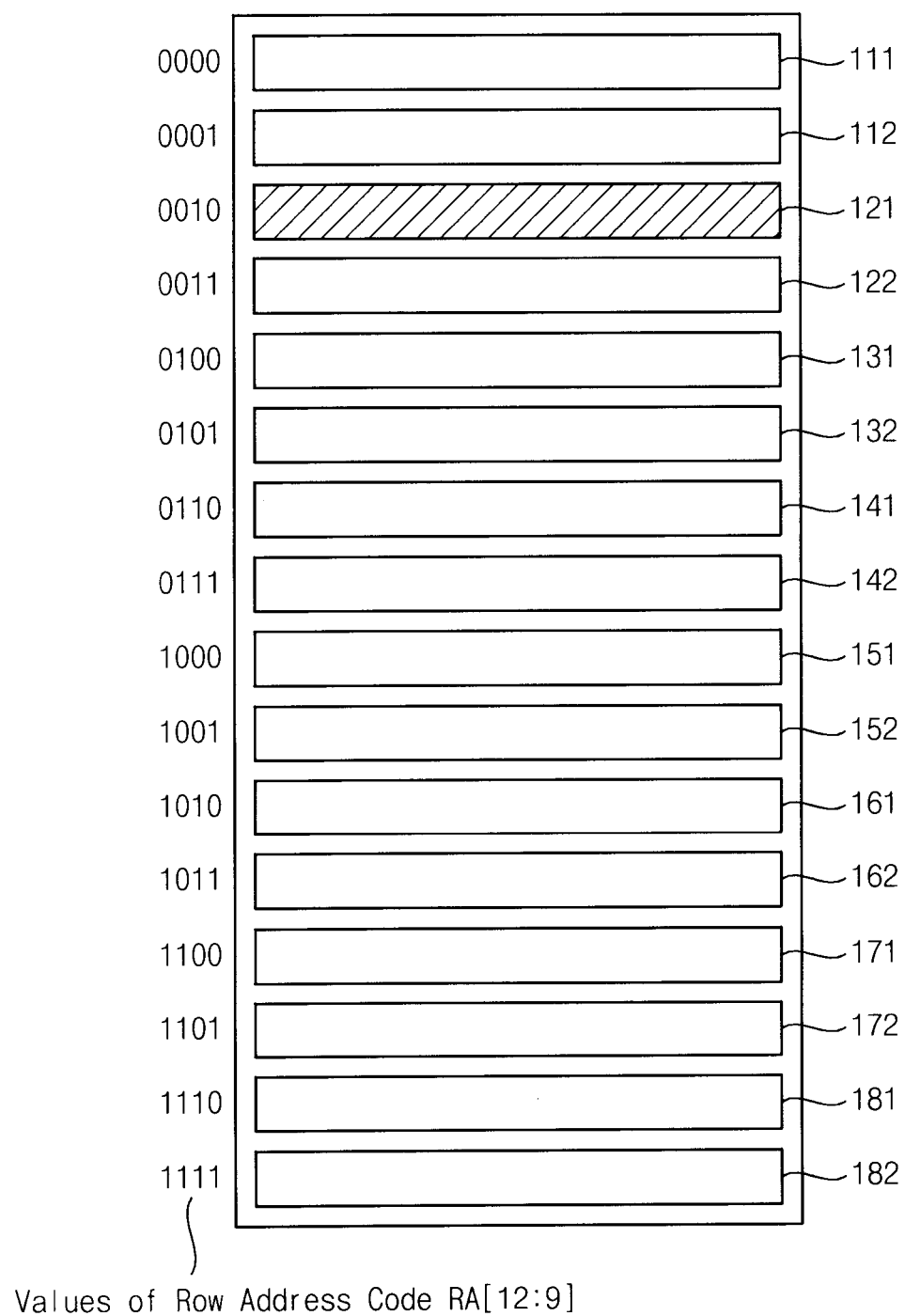
FIG. 4 is a block diagram illustrating a memory device and corresponding row address codes in accordance with an embodiment of the inventive concept.

FIG. 4 is a block diagram illustrating memory cell array 100 and corresponding row address code values in accordance with an embodiment of the inventive concept. In this embodiment, memory cell array 100 is divided into sixteen memory blocks 111, 112, 121, 122, 131, 132, 141, 142, 151, 152, 161, 162, 171, 172, 181, and 182. Each of these memory blocks corresponds to several rows of memory cells having row addresses RA[12:0]. More specifically, each memory block corresponds to a set of memory cells having the same row address bits RA[12:9].

For instance, as illustrated in FIG. 4, memory block 111 comprises memory cells having row address bits RA[12:9]="0000", memory block 112 comprises memory cells having row address bits RA[12:9]="0001", and so on. During refresh operations, rows of memory cells having the same value of row address bits RA[12:9] (i.e., row address code RA[12:9]) are refreshed at the same time. Moreover, as described in further detail below, rows of memory cells having a common abbreviated row address code may be refreshed at the same time to reduce the complexity of required refresh circuitry while limiting the overall frequency with which the memory blocks are refreshed.

Figure 5:
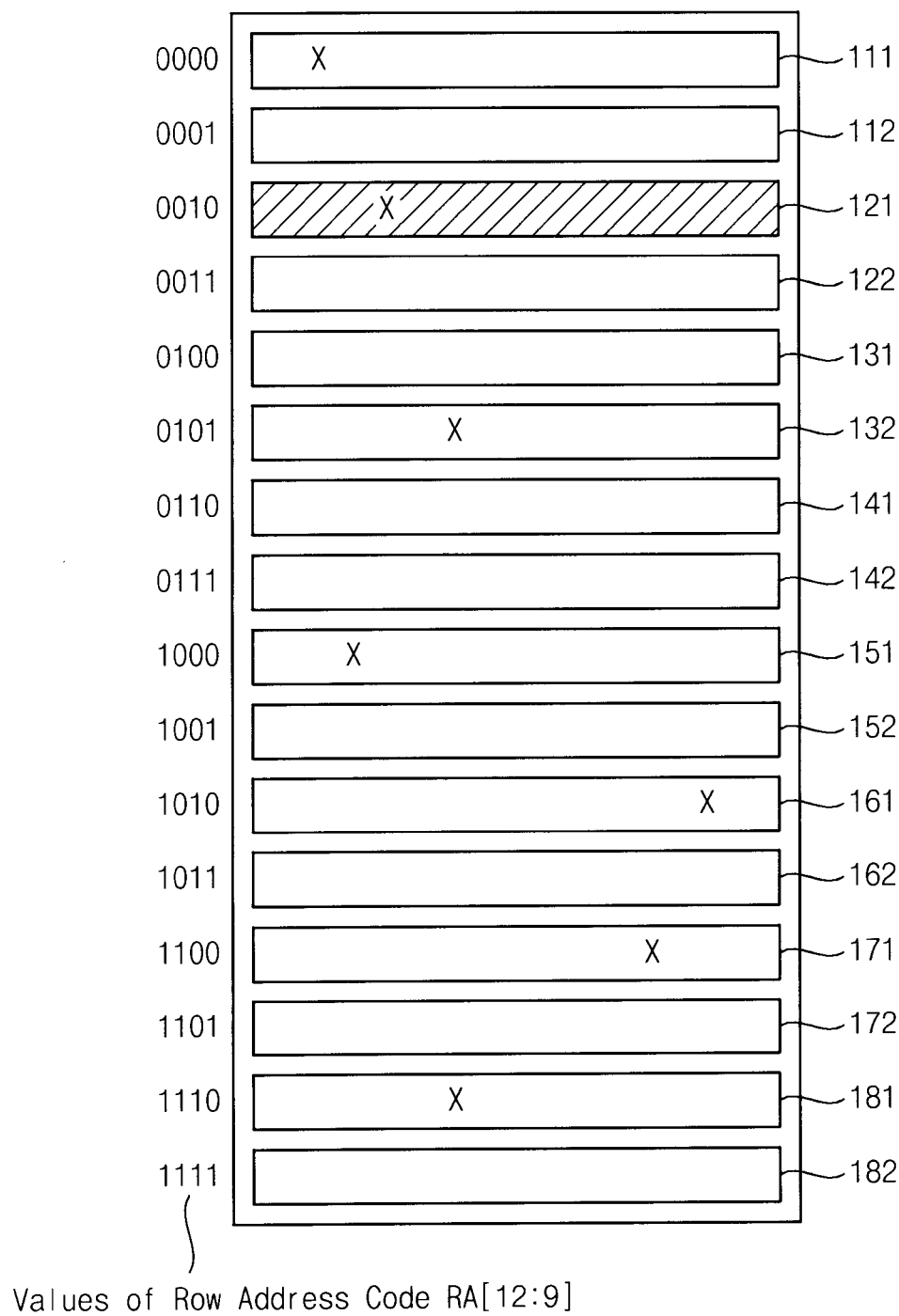
FIG. 5 is a block diagram illustrating the locations of substandard memory cells within memory blocks of the memory device illustrated in FIG. 4.

FIG. 5 is a block diagram illustrating the locations of substandard memory cells within memory blocks of memory cell array 100 illustrated in FIG. 4. The location of each substandard memory cell is illustrated by the letter "X". Accordingly, substandard memory cells can be identified in memory blocks 111, 121, 132, 151, 161, 171, and 181. Thus, memory cell array 100 comprises seven memory blocks with at least one substandard memory cell and nine memory blocks with no substandard memory cell.

Because each of memory blocks 111, 121, 132, 151, 161, 171, and 181 comprises at least one substandard memory cell, each of these memory blocks must be refreshed more frequently (i.e., with a shorter refresh period) than the other memory blocks in order to ensure that the substandard memory cells do not lose stored data. Thus, if all of the memory blocks in memory cell array 100 were refreshed using the shorter refresh cycle, the resulting power consumption would be inefficient because the nine memory blocks with no substandard memory cells require less frequent refreshing. On the other hand, if all of the memory blocks in memory cell array 100 were refreshed individually to ensure more frequent refreshing of each memory block with a substandard memory cell, and less frequent refreshing of each memory block without a substandard memory cell, the resulting circuit configuration would be relatively complex. Accordingly, in selected embodiments of the inventive concept described below, a compromise is made so that memory blocks are refreshed in groups to limit the required circuitry, and the groups are chosen so that memory blocks having substandard memory cells are refreshed simultaneously with other memory blocks having substandard memory cells in order to limit inefficient power consumption.

Figure 6:
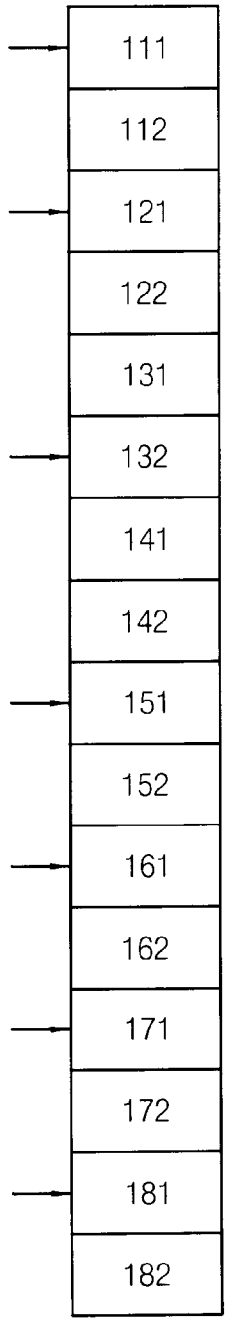
FIG. 6 is a table illustrating row address code values corresponding to the memory blocks of FIG. 5.

FIG. 6 is a table illustrating row address code values corresponding to the memory blocks of FIG. 5. In particular, each row of the table illustrates the row address bits RA12, RA11, RA10 and RA09 associated with a particular one of memory blocks 111 through 182. Arrows on the left side of FIG. 6 indicate memory blocks that include at least one substandard memory cell.

FIGS. 7A through 7D are tables illustrating abbreviated row address codes and values derived from the row address code RA[12:9] and corresponding values illustrated in FIG. 6. In particular, FIG. 7A illustrates an abbreviated row address code RA[12,11,10], which is generated by omitting row address bit RA09 from row address code RA[12:9]. Similarly, FIG. 7B illustrates an abbreviated row address code RA[12,11,09], which is generated by omitting row address bit RA10 from row address code RA[12:9]. FIG. 7C illustrates an abbreviated row address code RA[12,10,09], which is generated by omitting row address bit RA11 from row address code RA[12:9]. FIG. 7D illustrates an abbreviated row address code RA[11,10,09], which is generated by omitting row address bit RA12 from row address code RA[12:9]. In each of FIGS. 7A through 7D, arrows on the left side indicate memory blocks that contain at least one substandard memory cell.

The abbreviated row address codes illustrated in FIGS. 7A through 7D are candidate codes that may potentially be used to group together different memory blocks for refresh operations. Each candidate abbreviated row address code defines a distinct grouping of memory blocks into groups labeled "a," through "h," where the members of each group have the same value of the abbreviated row address code. For instance, in FIG. 7A, group "a" comprises memory blocks 111 and 112, which have the same value "000" of abbreviated row address code RA[12,11,10]. Similarly, group "b" in FIG. 7A comprises memory blocks 121 and 122 having the same value "001" of abbreviated row address code RA[12,11,10]. The candidate code that produces the minimum number of groups having at least one substandard memory cell will be used as the grouping for refresh operations.

In FIG. 7A, group "a" comprises memory blocks 111 and 112, which correspond to abbreviated row address code RA[12,11,10] value "000". Group "b" comprises memory blocks 121 and 122, which correspond to abbreviated row address code RA[12,11,10] value "001." Group "c" comprises memory blocks 131 and 132, which correspond to abbreviated row address code RA[12,11,10] value "010."

Group "d" comprises memory blocks 141 and 142, which correspond to abbreviated row address code RA[12,11,10] value "011." Group "e" comprises memory blocks 151 and 152, which correspond to abbreviated row address code RA[12,11,10] value "100." Group "f" comprises memory blocks 161 and 162, which correspond to abbreviated row address code RA[12,11,10] value "101." Group "g" comprises memory blocks 171 and 172, which correspond to abbreviated row address code RA[12,11,10] value "110." Group "h" comprises memory blocks 181 and 182, which correspond to abbreviated row address code RA[12,11,10] value "111."

In the grouping of FIG. 7A, seven out of the eight groups include at least one substandard memory cell. In particular, there is at least one substandard memory cell in groups "a," "b," "c," "e," "f," "g," and "h". Thus, if the memory blocks in each group are refreshed together, seven out of the eight groups will require a relatively shorter refresh period due to the presence of the substandard memory cells. As a result, the groupings of FIG. 7A result in only minimal reduction of the power consumption compared with a scenario where all of the memory blocks are refreshed with the relatively shorter refresh period.

In FIG. 7B, group "a" comprises memory blocks 111 and 121, which correspond to abbreviated row address code RA[12,11,09] value "000". Group "b" comprises memory blocks 112 and 122, which correspond to abbreviated row address code RA[12,11,09] value "001." Group "c" comprises memory blocks 131 and 141, which correspond to abbreviated row address code RA[12,11,09] value "010." Group "d" comprises memory blocks 132 and 142, which correspond to abbreviated row address code RA[12,11,09] value "011." Group "e" comprises memory blocks 151 and 161, which correspond to abbreviated row address code RA[12,11,09] value "100." Group "f" comprises memory blocks 152 and 162, which correspond to abbreviated row address code RA[12,11,09] value "101." Group "g" comprises memory blocks 171 and 181, which correspond to abbreviated row address code RA[12,11,09] value "110." Group "h" comprises memory blocks 172 and 182, which correspond to abbreviated row address code RA[12,11,09] value "111."

In the grouping of FIG. 7B, only four out of the eight groups include at least one substandard memory cell. In particular, the only groups with at least one substandard memory cell are groups "a," "d," "e," and "g". Thus, if the memory blocks in each group are refreshed together, only four out of the eight groups will require a relatively shorter refresh period due to the presence of the substandard memory cells. As a result, the groupings of FIG. 7B produce more efficient power consumption compared with the grouping of FIG. 7A. As a result, the abbreviated row address code RA[12,11,09] used to produce the grouping of FIG. 7B is considered to be a better candidate code than the abbreviated row address code RA[12,11,10] used to produce the groupings of FIG. 7A.

In FIG. 7C, group "a" comprises memory blocks 111 and 131, which correspond to abbreviated row address code RA[12,10,09] value "000". Group "b" comprises memory blocks 112 and 132, which correspond to abbreviated row address code RA[12,10,09] value "001." Group "c" comprises memory blocks 121 and 141, which correspond to abbreviated row address code RA[12,10,09] value "010." Group "d" comprises memory blocks 121 and 142, which correspond to abbreviated row address code RA[12,10,09] value "011." Group "e" comprises memory blocks 151 and 171, which correspond to abbreviated row address code RA[12,10,09] value "100." Group "f" comprises memory blocks 152 and 172, which correspond to abbreviated row address code RA[12,10,09] value "101." Group "g" comprises memory blocks 161 and 181, which correspond to abbreviated row address code RA[12,10,09] value "110." Group "h" comprises memory blocks 162 and 182, which correspond to abbreviated row address code RA[12,10,09] value "111."

In the grouping of FIG. 7C, five out of the eight groups include at least one substandard memory cell. In particular, there is at least one substandard memory cell in groups "a," "b," "c," "e" and "g". Thus, if the memory blocks in each group are refreshed together, five out of the eight groups will require a relatively shorter refresh period due to the presence of the substandard memory cells. As a result, the grouping of FIG. 7C results in more efficient power consumption than the grouping of FIG. 7A, but less efficient power consumption than the grouping of FIG. 7B.

In FIG. 7D, group "a" comprises memory blocks 111 and 151, which correspond to abbreviated row address code RA[11,10,09] value "000". Group "b" comprises memory blocks 112 and 132, which correspond to abbreviated row address code RA[11,10,09] value "001." Group "c" comprises memory blocks 121 and 141, which correspond to abbreviated row address code RA[11,10,09] value "010." Group "d" comprises memory blocks 121 and 142, which correspond to abbreviated row address code RA[11,10,09] value "011." Group "e" comprises memory blocks 151 and 171, which correspond to abbreviated row address code RA[11,10,09] value "100." Group "f" comprises memory blocks 152 and 172, which correspond to abbreviated row address code RA[11,10,09] value "101." Group "g" comprises memory blocks 161 and 181, which correspond to abbreviated row address code RA[11,10,09] value "110." Group "h" comprises memory blocks 162 and 182, which correspond to abbreviated row address code RA[11,10,09] value "111."

In the grouping of FIG. 7D, five out of the eight groups include at least one substandard memory cell. In particular, there is at least one substandard memory cell in groups "a," "c," "f," "e" and "g". Thus, if the memory blocks in each group are refreshed together, five out of the eight groups will require a relatively shorter refresh period due to the presence of the substandard memory cells. As a result, the grouping of FIG. 7D results in more efficient power consumption than the grouping of FIG. 7A, but less efficient power consumption than the grouping of FIG. 7B.

Because the grouping of FIG. 7B results in fewer groups having at least one substandard memory cell, the abbreviated row address code of FIG. 7B will be used to perform refresh operations instead of the other candidate abbreviated row address codes in FIGS. 7A, 7C, and 7D.

Figure 8:
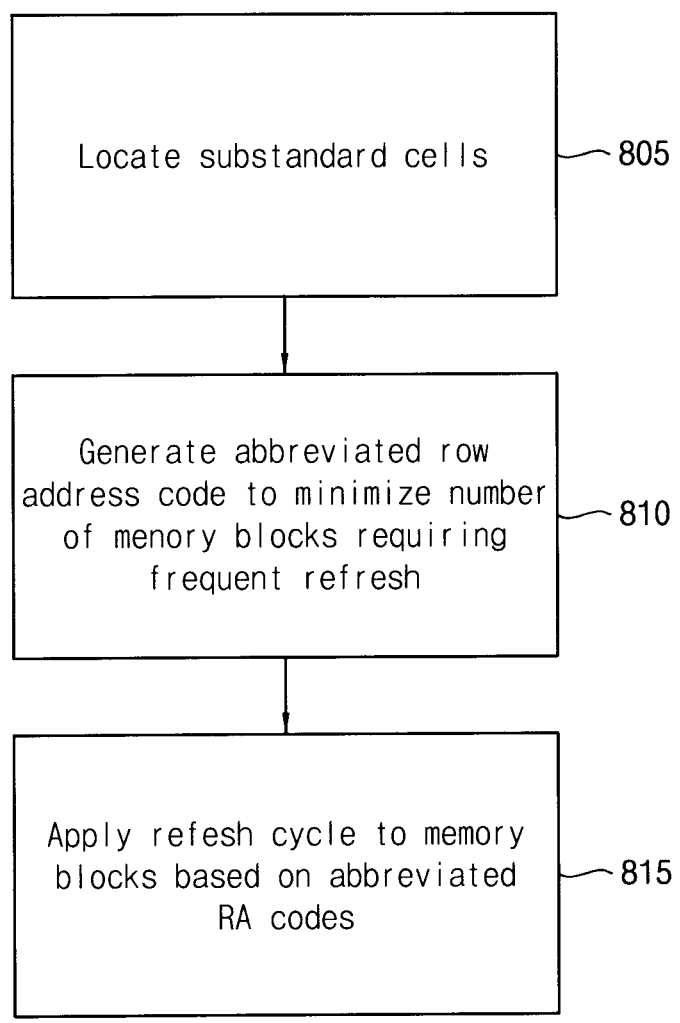
FIG. 8 is a flowchart illustrating a method of operating a memory device to refresh stored data in accordance with an embodiment of the inventive concept.

FIG. 8 is a flowchart illustrating a method 800 for operating a memory device to refresh stored data in accordance with an embodiment of the inventive concept. In the description that follows, example method steps are indicated by parentheses (xxx).

In the method of FIG. 8, a memory device is tested to determine the locations of substandard memory cells (805). Such a test may comprise, for instance, programming memory cells of multiple memory blocks to a predetermined logic state and then detecting the ability of each programmed memory cell to retain the predetermined logic state over time. The detection of each memory cell's ability to retain the predetermined logic state may be performed, for instance, by reading stored information from the memory device following a brief delay after the memory cells are programmed, such as 256 ns. If the stored information read from a memory cell after the brief delay does not correspond to the programmed logic state, the memory cell may be deemed a substandard memory cell. Otherwise, the memory cell may be deemed a normal memory cell.

The analysis of stored information to determine the locations of substandard memory cells may be performed by a device either internal or external to the memory device. As an example, an external device such as a CPU could read data out of the memory blocks and determine whether any of the data indicates a substandard memory cell.

After the memory device has been tested to determine the locations of substandard memory cells, an abbreviated row address code is then generated to create groupings of memory blocks that limit the number of memory blocks requiring frequent refreshing (810). In one embodiment, the abbreviated row address code is generated by considering a number of candidate codes each omitting a different row address bit from a row address code, and then identifying the candidate with the fewest number of groups having at least one substandard memory cell as the abbreviated row address code to be used for refresh operations.

Once the abbreviated row address code has been identified, a refresh operation is performed simultaneously on memory blocks having the same value of the abbreviated row address code (815). Moreover, using the abbreviated row address code to cycle through memory blocks, a refresh operation is performed sequentially on groups of memory cells such as those illustrated in FIG. 7 to complete a refresh cycle.

Figure 9:
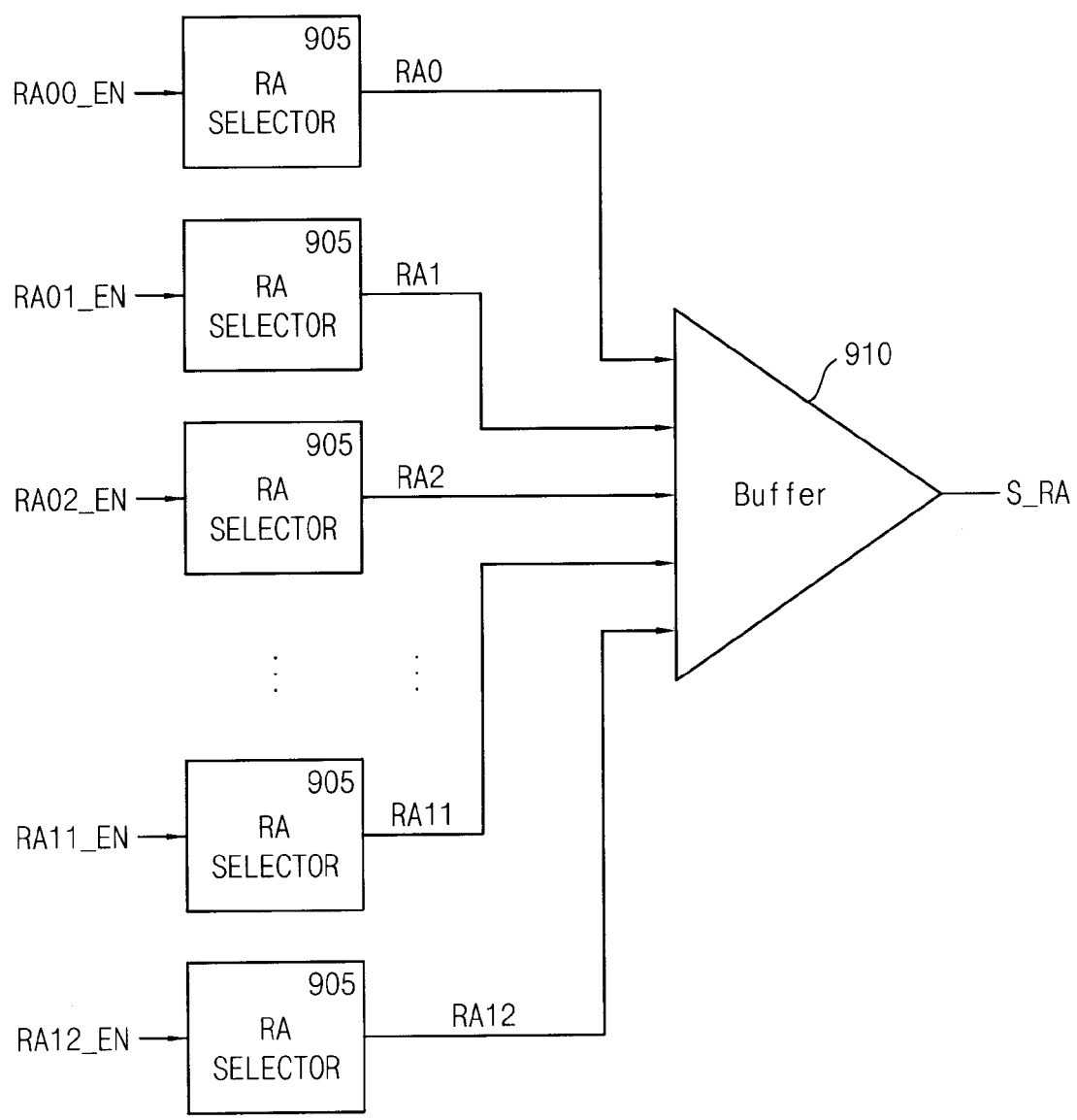
FIG. 9 is a block diagram illustrating a selector unit for selecting abbreviated row address codes to be used for refresh operations of a memory device in accordance with an embodiment of the inventive concept.

FIG. 9 is a block diagram illustrating a selector unit 900 for selecting row address codes to be used for refresh operations of a memory device in accordance with an embodiment of the inventive concept. Selector unit 900 comprises a plurality of RA selectors 905 each receiving an enable signal corresponding to a bit of row address RA[12:0] and selectively outputting the corresponding bit based on an abbreviated row address code to be used for refresh operations. For instance, where the abbreviated row address code RA[12,11,09], illustrated in FIG. 7B, is used to perform refresh operations, selector 900 receives the corresponding enable signals RA12_EN, RA11_EN, and RA09_EN and generates row address code selection signal S_RA based on the values of row address bits RA12, RA11, and RA09.

Figure 10:
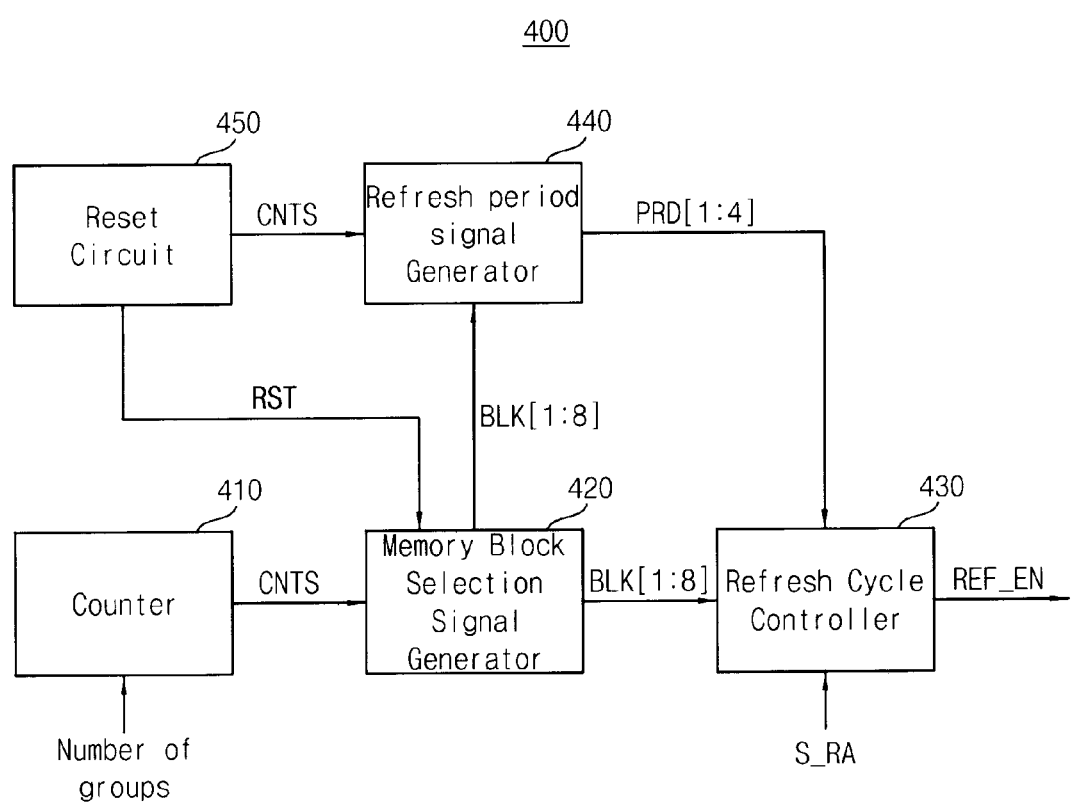
FIG. 10 is a block diagram illustrating a control circuit for controlling the timing of refresh operations in accordance with an embodiment of the inventive concept.

FIG. 10 is a block diagram illustrating an embodiment of control circuit 400. In this embodiment, control circuit 400 comprises a counter 410, a memory block selection signal generator 420, a refresh cycle controller 430, a refresh period signal generator 440, and a reset circuit 450.

Counter 410 receives a number of memory block groups to be refreshed during a refresh cycle. In the example of FIG. 7, for instance, the number of groups is eight, including groups "a"-"h". Based on the number of groups received, counter 410 generates a counter signal CNTS to control the timing of refresh operations.

Memory block selection signal generator 420 receives counter signal CNTS and a reset signal RST and generates block selection signals BLK[1:8] in synchronization with counter signal CNTS. Block selection signals BLK[1:8] are successively asserted during a refresh cycle so that refresh operations are performed in succession on memory block groups "a"-"h", which correspond to indices 1 through 8. Reset signal RST resets index memory block selection signal generator 420 and refresh period signal generator 440 to initial values when control circuit 400 is initialized. Block selection signal BLK1 and refresh period signal PRD1 are asserted before other signals following initialization of elements 420 and 440.

Refresh cycle controller 430 receives block selection signals BLK[1:8], row address code selection signal S_RA, and a refresh period signals PRD[1:4], and generates refresh enable signal REF_EN based on the received signals. Block selection signals BLK[1:8] indicate a group of memory blocks to be refreshed at the current stage of a refresh cycle, and refresh period signals PRD[1:4] indicate a current refresh period. Row address code S_RA indicates which row address bits define the grouping of memory blocks and therefore the order in which the memory blocks are to be refreshed. Together, block selection signals BLK[1:8], refresh period signals PRD[1:4], and row address code selection signal S_RA determine which memory blocks are to be refreshed during a particular time interval. Accordingly, the value of refresh enable signal REF_EN is determined by the combination of these signals.

Refresh cycle controller 430 may further store or receive information indicating which groups of memory blocks use a relatively shorter refresh period and which groups use a relatively longer refresh period. Memory blocks using a relatively shorter refresh period may be refreshed, for instance, during each of refresh periods PRD1 through PRD4, while memory blocks using a relatively longer refresh period may be refreshed during only one or two of refresh periods PRD1 through PRD4.

To illustrate the operation of refresh cycle controller 430, suppose row address code selection signal indicates that abbreviated row address code RA[12,11,09] of FIG. 7B designates groups of memory blocks to be refreshed together and block selection signals BLK[1:8] and refresh period signals PRD[1:4] indicate which of the groups may be refreshed currently. In this case, since group "a" includes substandard memory cells, group "a" may be refreshed each time block selection signal BLK1 is asserted during a refresh cycle. On the other hand, since group "b" does not include any substandard memory cells, group "b" may be refreshed only when both block selection signal BLK2 is asserted and refresh period signal PRD1 is asserted. Where group "a" is refreshed regardless of the value of refresh period signals PRD[1:4] and group "b" is refreshed only when refresh period PRD1 is asserted, the memory blocks of group "b" will be refreshed four times less frequently than the memory blocks of group "a".

Refresh period signal generator 440 receives block selection signals BLK[1:8] and reset signal RST and generates refresh period signals PRD[1:4] in synchronization with block selection signals BLK[1:8]. Refresh period signals PRD[1:4] are asserted in succession, with each successive signal remaining asserted for a complete cycle of block selection signals BLK[1:8].

Reset circuit 450 generates reset signal RST to reset memory block selection signal generator 420 and refresh period signal generator 440. Such reset operations may occur, for instance, when control circuit 400 is initialized, or in response to another event.

Figure 11:
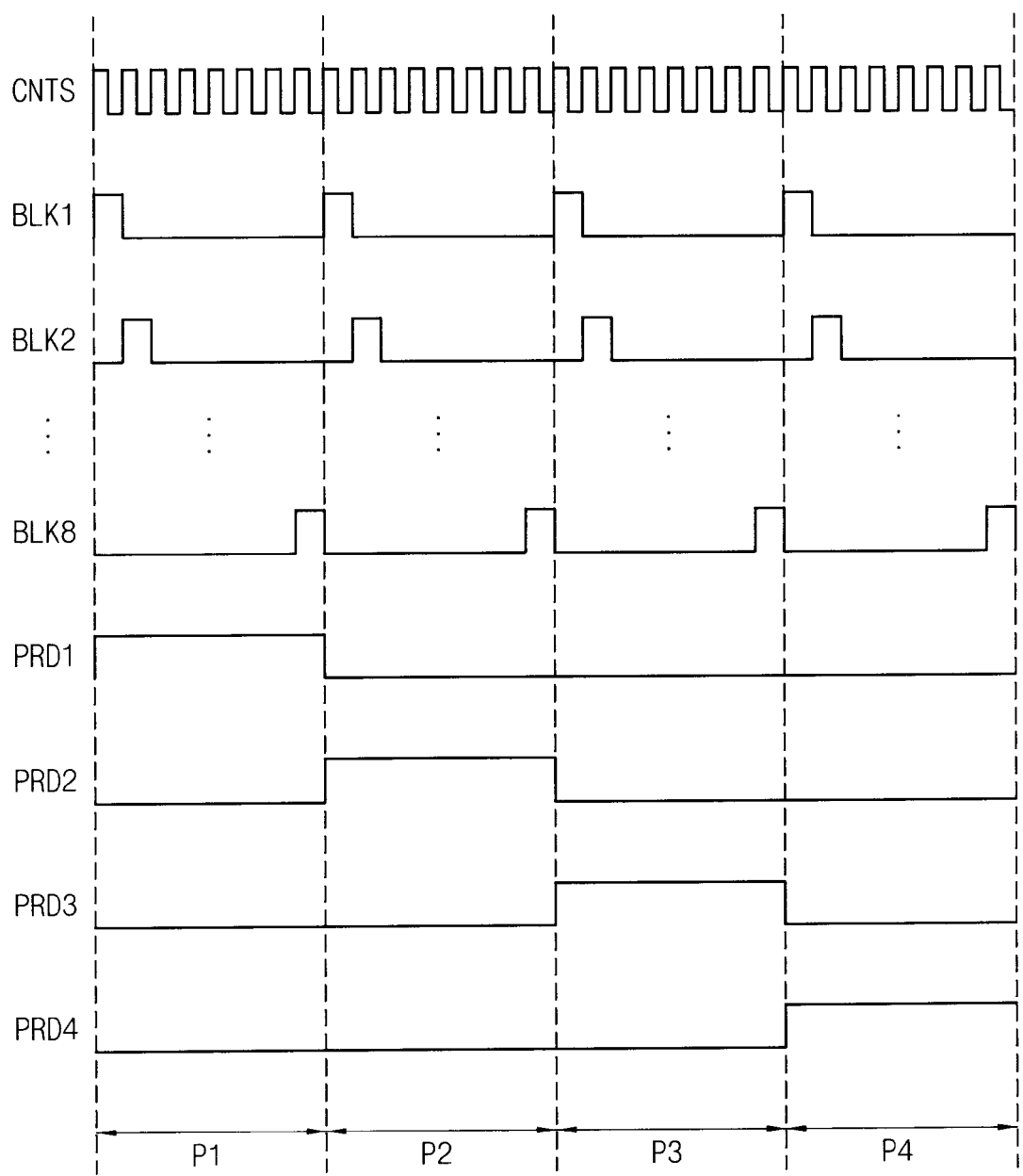
FIG. 11 is a waveform timing diagram illustrating signals used to perform a refresh operation in accordance with an embodiment of the inventive concept.

FIG. 11 is a waveform timing diagram illustrating the operation of control circuit 400 in accordance with one embodiment of the inventive concept. In the example of FIG. 11, control circuit 400 performs refresh operations in four periods P1, P2, P3, and P4, which correspond to refresh period signals PRD1, PRD2, PRD3, and PRD4, respectively.

During each period, counter signal CNTS passes through eight cycles, during which block selection signals BLK[1:8] are successively asserted. Meanwhile, refresh period signals PRD1, PRD2, PRD3, and PRD4 are asserted in succession during periods P1, P2, P3, and P4. In order to provide a longer refresh period to some groups of memory blocks while providing a shorter refresh period to other groups of memory blocks, some groups of memory blocks are refreshed during each of periods P1-P4, while others are refreshed only during a subset of periods P1-P4. In this way, refresh period signals PRD[1:4] can be used to control the refresh rate of different groups of memory blocks.

Figure 12:
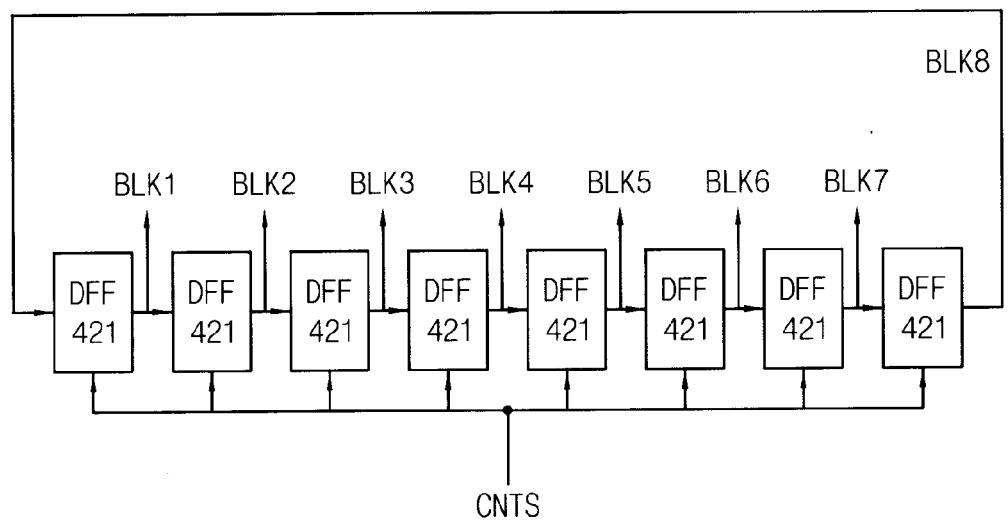
FIG. 12 is a block diagram illustrating a memory block selection signal generator in accordance with an embodiment of the inventive concept.

FIG. 12 is a block diagram illustrating an embodiment of memory block selection signal generator 420. In this embodiment, memory block selection signal generator 420 comprises a shift register comprising eight data flip flops DFF 421 through DFF 428. These flip flops transfer a single bit of data in synchronization with counter signal CNTS to generate the pattern of block selection signals BLK[1:8] illustrated in FIG. 11.

Figure 13:
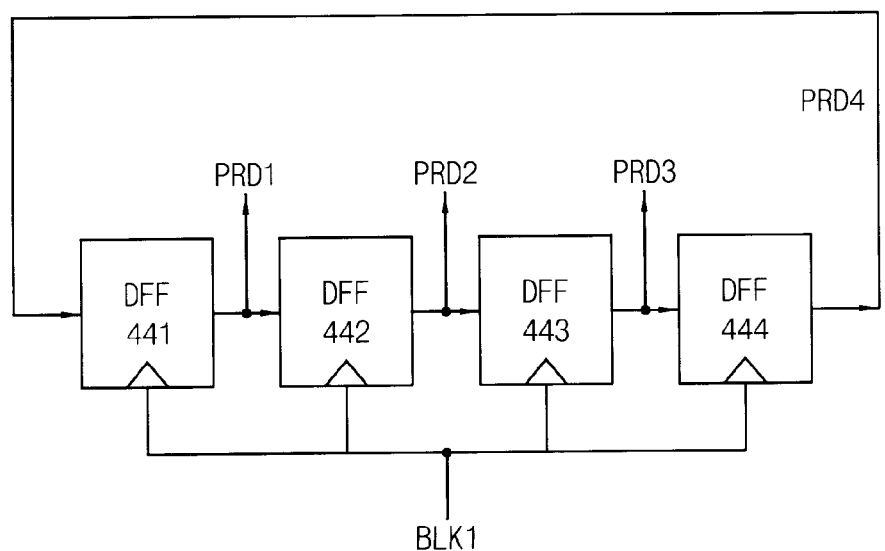
FIG. 13 is a block diagram illustrating a refresh period signal generator in accordance with an embodiment of the inventive concept.

FIG. 13 is a block diagram illustrating an embodiment of refresh period signal generator 440. In this embodiment, refresh period signal generator 440 comprises a shift register comprising four data flip flops DFF 41 through DFF 444. These flip flops transfer a single bit of data in synchronization with block selection signal BLK1 to generate the pattern of refresh period signals PRD[1:4] illustrated in FIG. 11.

Figure 14A:
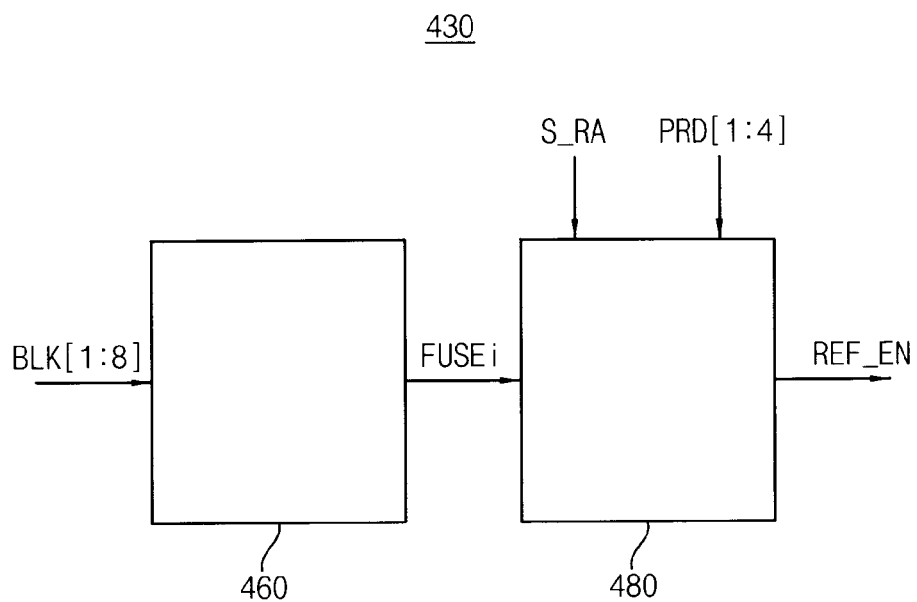
FIG. 14A is a block diagram illustrating a refresh cycle controller in accordance with an embodiment of the inventive concept.

FIG. 14A is a block diagram illustrating an embodiment of refresh cycle controller 430. In this embodiment, refresh cycle controller 430 comprises a fuse unit 460 and refresh enable signal generator 480.

Fuse unit 460 receives one of block selection signals BLK [1:8], which will be referred to as block selection signal BLKi, and generates a corresponding fuse signal FUSEi. The value of fuse signal FUSEi depends on whether block selection signal BLKi corresponds to a group of memory blocks including at least one substandard memory cell. In particular, where block selection signal BLKi corresponds to a group of memory blocks with at least one substandard memory cell, fuse signal FUSEi assumes a logic state that causes a refresh operation to be performed during each of periods P1 through P4 in FIG. 11. Otherwise, where selection signal BLKi corresponds to a group of memory blocks without any substandard memory cells, fuse signal FUSEi assumes a logic state that causes a refresh operation to be performed during only a subset of periods P1 through P4. To establish the logical relationship between block selection signal BLKi and fuse signal FUSEi, a fuse may be cut within fuse unit 460 upon determining the groups in which memory blocks are to be refreshed. The manner of cutting the fuses will be described in further detail with reference to FIGS. 14B through 14D below.

Refresh enable signal generator 480 receives row address code selection signal S_RA, refresh period signals PRD[1:4], and fuse signal FUSEi, and generates refresh enable signal REF_EN to refresh group "i" based on the values of the received signals. For instance, using block selection signal BLK1, and row address code selection signal S_RA set to RA12, RA11, RA09 as in FIG. 7B, refresh enable signal generator 480 controls refresh enable signal REF_EN so that memory blocks 111 and 121 are refreshed together during each of periods P1 through P4. In this case, the value of selection signal S_RA causes memory blocks 111 and 121 to be refreshed together, the value of FUSEi causes these memory blocks to be refreshed during each of periods P1 through P4, and the refresh period signals PRD[1:4] indicate the timing of the periods P1 through P4 to control the timing so that refresh enable signal REF_EN is asserted during appropriate intervals.

Figure 14B:
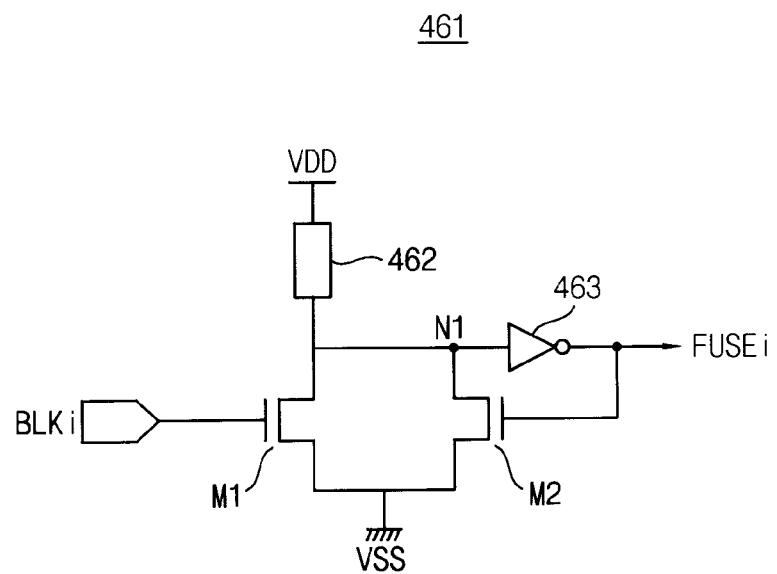
FIG. 14B is a circuit diagram illustrating a fuse unit within the refresh cycle controller of FIG. 14A.

FIG. 14B is a circuit diagram illustrating a fuse circuit 461 contained in an embodiment of fuse unit 460. FIG. 14C is a table illustrating a relationship between different states of the fuse unit of FIG. 14B and the operation of the refresh cycle controller. FIG. 14D is a table further illustrating a relationship between different states of the fuse unit of FIG. 14B and the operation of the refresh cycle controller.

Fuse circuit 461 comprises a fuse 462, an inverter 463, a voltage source VDD, ground VSS, transistors M1 and M2, and an input terminal receiving block selection signal BLKi. Where block selection signal BLKi corresponds to a group of memory blocks containing at least one substandard memory cell, fuse 462 is not cut. As a result, fuse signal FUSEi assumes a logic state "0", causing refresh operations to be performed during each of the periods P1 through P4 on the memory blocks corresponding to block selection signal BLKi, as indicated in the table of FIG. 14C. On the other hand, where block selection signal BLKi corresponds to a group of memory blocks containing no substandard memory cells, fuse 462 is cut. As a result, fuse signal FUSEi assumes a logic state "1", causing refresh operations to be performed only during periods P1 and P3 on the memory blocks corresponding to block selection signal BLKi, as indicated in the table of FIG. 14C. In other words, refresh operations are performed twice as frequently when fuse signal FUSEi is in logic state "0" as opposed to logic state "1".

As indicated by FIG. 14D, fuse 462 is not cut in fuse circuits 461 corresponding to memory blocks with substandard memory cells, and fuse 462 is cut in fuse circuits 461 corresponding to memory blocks with no substandard memory cells. It should be recognized, however, that the relationship in FIG. 14D between cut fuses and memory blocks with substandard memory cells is a design choice and could be reversed or modified in various ways.

Figure 15A:
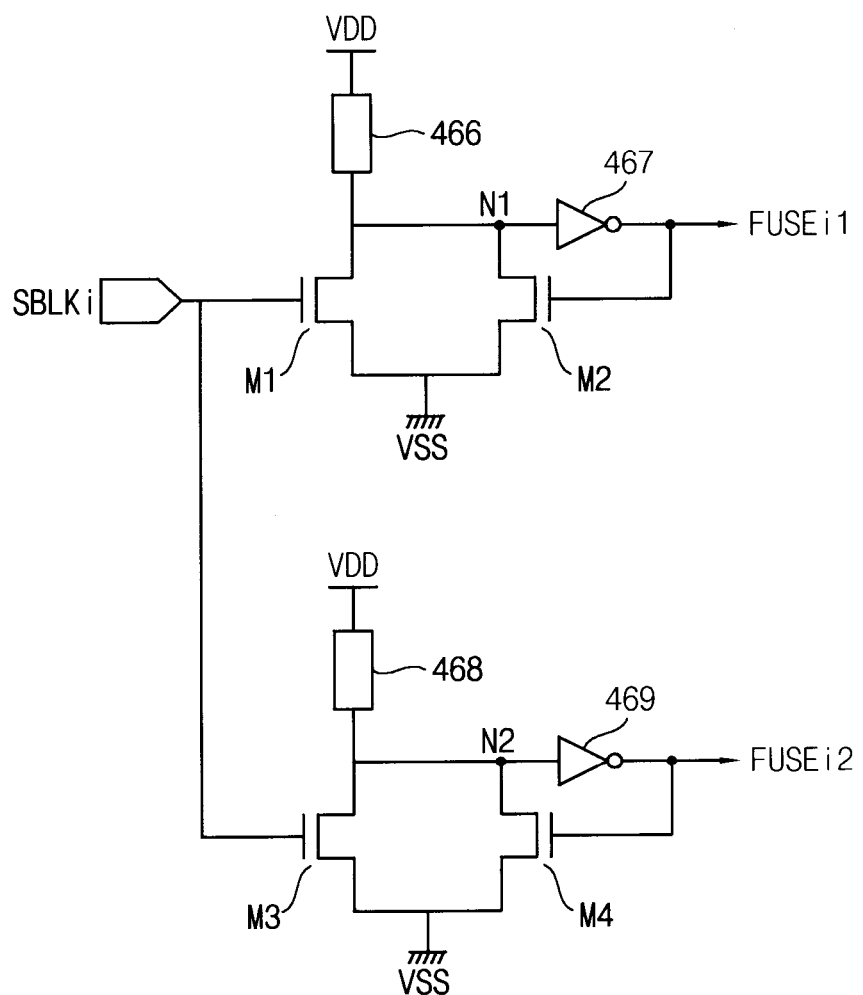
FIG. 15A is a circuit diagram illustrating an alternative fuse unit within the refresh cycle controller of FIG. 14A.

FIG. 15A is a circuit diagram illustrating an alternative fuse circuit 465 within the refresh cycle controller of FIG. 14A. FIG. 15B is a table illustrating a relationship between different states of the fuse unit of FIG. 15A and the operation of the refresh cycle controller.

Fuse circuit 465 functions similar to fuse circuit 461 except that fuse circuit 465 can assume four different configurations allowing refresh operations to be performed during different combinations of periods P1 through P4. The four different configurations of fuse circuit 465 are obtained by cutting or not cutting fuses 466 and 468. Where fuses 466 and 468 remain uncut, fuse signals FUSEi1 and FUSEi2 assume a logic state "00," resulting in a refresh operation during each of periods P1 through P4 as indicated in FIG. 15B. Similarly, where fuses 466 and 468 are cut or not cut in the remaining alternative combinations, fuse signals FUSEi1 and FUSEi2 assume logic states "01", "10", and "11" to produce refresh operations during various periods shown in FIG. 15B. By using the different refresh patterns shown in FIG. 15B, different memory blocks can be refreshed with more than two different intervals to accommodate substandard cells with varying grades of charge retention characteristics.

Figure 16:
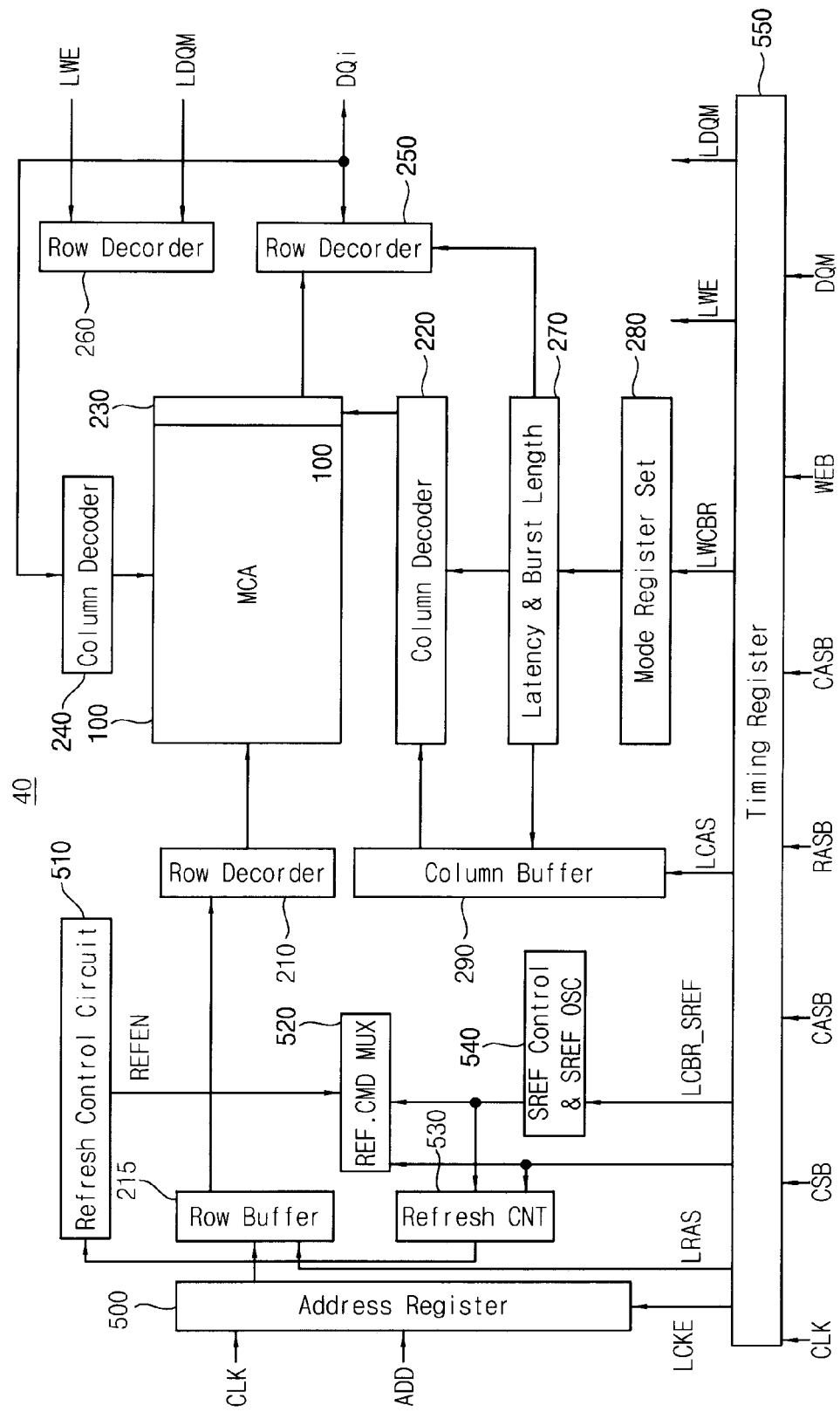
FIG. 16 is a block diagram illustrating another alternative configuration of the memory device illustrated in FIG. 1.

FIG. 16 is a block diagram illustrating another alternative configuration of memory device 40 illustrated in FIG. 1. This configuration is similar to that illustrated in FIG. 2, except that the configuration of FIG. 16 comprises various additional components for controlling memory access operations and refresh operations, and has a modified organization of the elements in control circuit 400. For instance, the configuration of FIG. 16 comprises a refresh state (SREF) controller 540 for controlling a refresh state of memory device 40 and generating an oscillation signal OSC. Additionally, this configuration incorporates elements 420, 430, 440, and 450 of control circuit 400 into a refresh control unit 510 and incorporates element 410 into a refresh counter 530.

As illustrated by the foregoing, the inventive concept provides methods, devices, and systems in which memory blocks having substandard memory cells are refreshed together while memory blocks having no substandard memory cells are refreshed together. As a result, these methods, systems and devices tend to limit inefficient power consumption while also limiting inefficient use of chip area.

Finally, the foregoing is illustrative of selected embodiments and is not to be construed as limiting thereof. Many modifications may be made to the embodiments without materially departing from the novel teachings and advantages of the inventive concept. Accordingly, all such modifications may be included within the scope of the inventive concept as defined by the claims.

What is claimed is:

1. A method of operating a memory device, comprising:
identifying a first plurality of memory blocks each comprising at least one substandard memory cell;
identifying a second plurality of memory blocks each comprising no substandard memory cells;
generating a plurality of candidate first row address codes by omitting different one or more bits of a row address corresponding to two or more memory blocks, where at least one of the two or more memory blocks is from the first plurality of memory blocks;
selecting one of the plurality of candidate first row address codes as a first row address code;
generating a second row address code by omitting one or more bits of a row address corresponding to at least two memory blocks from the second plurality of memory blocks;
performing a first refresh operation simultaneously on the memory blocks having the first row address code value using a first refresh period; and
performing a second refresh operation simultaneously on the memory blocks having the second row address code value with a second refresh period longer than the first refresh period.

2. The method of claim 1, wherein identifying the first plurality of memory blocks comprises:
programming memory cells of multiple memory blocks in the memory device to a predetermined logic state; and
detecting the ability of each programmed memory cell to retain the predetermined logic state over time.

3. The method of claim 2, further comprising:
upon determining that one or more memory cells within a selected memory block fails to retain stored information for the second refresh period, assigning the selected memory block to the first plurality.

4. The method of claim 1, further comprising:
upon identifying the first plurality of memory blocks each comprising at least one substandard memory cell, cutting selected fuses of a control circuit to adjust the timing of refresh operations to be performed on the first plurality of memory blocks to the first refresh period.

5. A method of operating a memory device, comprising:
identifying a first plurality of memory blocks each comprising at least one substandard memory cell;
identifying a second plurality of memory blocks each comprising no substandard memory cells;
generating a first row address code by omitting one or more bits of a row address corresponding to two or more memory blocks, where at least one of the two or more memory blocks is from the first plurality of memory blocks;
generating a second row address code by omitting one or more bits of a row address corresponding to at least two memory blocks from the second plurality of memory blocks;
performing a first refresh operation simultaneously on the memory blocks having the first row address code value using a first refresh period; and
performing a second refresh operation simultaneously on the memory blocks having the second row address code value with a second refresh period longer than the first refresh period,
wherein generating the first row address code comprises:
identifying a plurality of unabbreviated row address code values each having a bit-length "N" and corresponding to a single memory block;
identifying a plurality of abbreviated row address code values each having a bit-length less than "N" and corresponding to more than one of the unabbreviated row address code values and the corresponding memory blocks; and
distinguishing one of the abbreviated row address code values as the first value upon determining that the one of the abbreviated row address code values corresponds to at least one memory block comprising a substandard memory cell.

6. The method of claim 5, further comprising:
determining a mapping between the unabbreviated row address code values and abbreviated row address code values by omitting one or more bits of the unabbreviated row address code values based on the locations of substandard memory cells within the memory blocks corresponding to the unabbreviated row address code values.

7. The method of claim 6, wherein the mapping minimizes the number of abbreviated row address code values corresponding to at least one memory block having one or more substandard memory cells.

8. The method of claim 1, wherein the memory device comprises a dynamic random access memory.

9. The method of claim 1, wherein the second refresh period is at least 256 ns.

10. A method of operating a memory device, comprising:
identifying a row address code corresponding to a plurality of memory blocks, wherein different values of the row address code identify different ones of the plurality of memory blocks;
determining whether each of the plurality of memory blocks comprises at least one substandard memory cell;
generating a plurality of candidate abbreviated row address codes by omitting different one or more bits of the row address code based on which of the memory blocks comprises at least one substandard memory cell;
selecting one of the plurality of candidate abbreviated row address codes as an abbreviated row address code; and
performing a refresh operation by simultaneously refreshing memory blocks having the same value of the abbreviated row address code.

11. The method of claim 10, further comprising:
refreshing all of the memory blocks corresponding to a particular value of the abbreviated row address code using a first refresh period if at least one of the memory blocks corresponding to the particular value comprises a substandard memory cell; and
refreshing all of the memory blocks corresponding to the particular value using a second refresh period longer than the first period if none of the memory blocks corresponding to the particular value comprises a substandard memory cell.

12. The method of claim 11, wherein the second refresh period is at least double the first refresh period.

13. The method of claim 10, wherein said generating the plurality of candidate abbreviated row address codes comprises:

generating a first candidate abbreviated row address code by omitting a first row address bit from the row address code; and generating a second candidate abbreviated row address code by omitting a second row address bit from the row address code while retaining the first row address bit in the row address code, and said selecting one of the plurality of candidate abbreviated row address codes comprises:

identifying a first set of groups of memory blocks, where each group comprises at least two memory blocks having a same value of the first candidate abbreviated row address code;

identifying a second set of groups of memory blocks, where each group comprises at least two memory blocks having a same value of the second candidate abbreviated row address code;

determining a first number indicating how many groups within the first set have at least one memory block with a substandard memory cell;

determining a second number indicating how many groups within the second set have at least one memory block with a substandard cell; and assigning the first or second candidate abbreviated row address code as the abbreviated row address code based on whether the first number is larger than the second number or vice versa.

14. The method of claim 10, wherein the refresh operation is performed with a first refresh period if one or more of the simultaneously refreshed memory blocks has a substandard memory cell, and otherwise, the refresh operation is performed with a second refresh period longer than the first refresh period.

15. A method of performing a refresh operation in a memory device, comprising:

refreshing a first group of memory blocks using a first refresh period; and refreshing a second group of memory blocks using a second refresh period longer than the first refresh period;

wherein the first group comprises memory blocks with substandard memory cells and the second group comprises no memory blocks with substandard memory cells;

selecting an abbreviated row address code from a plurality of candidate abbreviated row address codes; and wherein the grouping of the memory blocks into the first and second groups minimizes the total number of memory blocks using the first refresh period while allowing memory cells with the same value of the abbreviated row address code to be refreshed simultaneously.

16. The method of claim 15, further comprising:

receiving an indication of the memory blocks having substandard memory cells, wherein the abbreviated row address code is selected based on which memory blocks have the substandard memory cells.

17. The method of claim 15, wherein the memory device is a dynamic random access memory.

18. The method of claim 15, wherein the second refresh period is at least double the first refresh period.

19. The method of claim 15, further comprising:

cutting selected fuses of a control circuit to adjust the timing of refresh operations to be performed on the first group of memory blocks to the first refresh period.

20. The method of claim 15, further comprising:

refreshing a third group of memory blocks using a third refresh period shorter than the first refresh period;

wherein the third group comprises memory blocks with substandard memory cells.

* * * * *